(12) United States Patent
Kitagawa

(10) Patent No.: US 9,260,643 B2
(45) Date of Patent: Feb. 16, 2016

(54) SLURRY AND METHOD FOR PRODUCING SLURRY

(71) Applicant: SHIN-ETSU HANDOTAI CO., LTD., Tokyo (JP)

(72) Inventor: Koji Kitagawa, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/349,276

(22) PCT Filed: Oct. 4, 2012

(86) PCT No.: PCT/JP2012/006377
§ 371 (c)(1),
(2) Date: Apr. 2, 2014

(87) PCT Pub. No.: WO2013/061519
PCT Pub. Date: May 2, 2013

(65) Prior Publication Data
US 2015/0000208 A1    Jan. 1, 2015

(30) Foreign Application Priority Data
Oct. 27, 2011 (JP) .................. 2011-235924

(51) Int. Cl.
*C09G 1/02* (2006.01)
*C09K 3/14* (2006.01)
*B28D 5/00* (2006.01)
*B28D 5/04* (2006.01)
*H01L 21/304* (2006.01)

(52) U.S. Cl.
CPC .............. *C09K 3/1472* (2013.01); *B28D 5/007* (2013.01); *B28D 5/045* (2013.01); *C09K 3/1409* (2013.01); *C09K 3/1463* (2013.01); *H01L 21/304* (2013.01)

(58) Field of Classification Search
CPC ............. C09G 1/02; C09K 13/00; C09K 3/00
See application file for complete search history.

(56) References Cited

U.S. PATENT DOCUMENTS

| 6,046,110 A | * | 4/2000 | Hirabayashi et al. | ......... 438/693 |
| 6,383,991 B1 | | 5/2002 | Hashimoto et al. | |
| 2002/0003225 A1 | * | 1/2002 | Hampden-Smith et al. | . 252/79.1 |
| 2011/0268994 A1 | * | 11/2011 | Miyatani | ..... 428/846.9 |
| 2012/0108064 A1 | * | 5/2012 | Suzuki et al. | ............ 438/689 |

FOREIGN PATENT DOCUMENTS

| EP | 2 415 853 A1 | 2/2012 |
| JP | A-09-314459 | 12/1997 |
| JP | A-2006-224266 | 8/2006 |
| JP | A-2008-222979 | 9/2008 |
| TW | 201042028 A1 | 12/2010 |
| WO | WO 2010/113678 A1 | 10/2010 |
| WO | WO2011/001793 * | 1/2011 .............. B34B 37/00 |

OTHER PUBLICATIONS

International Preliminary Report on Patentability issued in International Patent Application No. PCT/JP2012/006377 dated Apr. 29, 2014.
Feb. 26, 2015 Office Action issued in Singapore Patent Application No. 11201401251T.
International Search Report issued in International Application No. PCT/JP2012/006377 dated Oct. 30, 2012.
Mar. 24, 2015 Office Action issued in Taiwanese Application No. 101139497.
Aug. 12, 2015 Singapore Office Action issued in Singapore Application No. 11201401251T.
Sep. 2, 2015 Office Action issued in Chinese Application No. 201280051638.7.

* cited by examiner

*Primary Examiner* — Pegah Parvini
(74) *Attorney, Agent, or Firm* — Oliff PLC

(57) ABSTRACT

The present invention is directed to a method for producing a slurry used in a wire saw, including: re-pulverizing with a jet mill part or all of the abrasive grains pulverized with a roller mill or a ball mill such that the abrasive grains have an average circularity of 0.900 or more; and blending the abrasive grains whose the average circularity is 0.900 or more with a coolant to produce the slurry, and to a slurry including blended abrasive grains having an average circularity of 0.900 or more. The invention enables suppression of reduction in slicing capability due to reduction in abrasive-grains concentration and of increased costs due to reduction in slicing quality and in productivity, even when abrasive grains having a grain diameter smaller than that of #2000-size abrasive grains are used to reduce a kerf loss.

5 Claims, 3 Drawing Sheets

SLURRY AND METHOD FOR PRODUCING SLURRY

TECHNICAL FIELD

The present invention relates to slurry for use in a wire saw for slicing a workpiece, such as an ingot, and a method for producing the slurry.

BACKGROUND ART

In recent years, wire saws have been used to slice workpieces, such as semiconductor materials, magnetic materials, and ceramic, in production processes of semiconductor wafers, solar cells for a solar battery, etc.

The wire saw is an apparatus for slicing a workpiece by imparting reciprocating motion to a wire, and pressing the workpiece against the wire while supplying slurry into which free abrasive grains, such as silicon carbide grains, are blended. The slurry may contain either an oil coolant or a water-soluble coolant, and the water-soluble coolant has recently become mainstream from the viewpoint of an environmental load, such as recycling and drain disposal after use.

It is known that such a slicing process of a workpiece with a wire saw produces swarf, which becomes a material loss (a kerf loss), with a width corresponding to the sum of a wire diameter and about two to three times an abrasive grain diameter, and thinned wires or abrasive grains having smaller diameter are accordingly used to reduce the kerf loss (See Patent Document 1, for example).

In general, the size of an abrasive grain is often represented by a grain size, and the classification thereof is defined in R6001 of Japanese Industrial Standards (JIS), for example.

Conventional slicing processes of semiconductor silicon wafers employed 0.16-mm-diameter piano wires and slurry into which silicon carbide abrasive grains whose the diameter at a cumulative height of 50% is 11.5 µm (also referred to as a grain diameter), #1000-size abrasive grains, are blended, for example. In recent years, however, thinning of wires and shrinking of abrasive grains have been advanced to reduce the kerf loss so that piano wires with a diameter of 0.14 mm and slurry into which silicon carbide abrasive grains whose the grain diameter is 8.0 µm are blended (abrasive grain size #1500) are used.

CITATION LIST

Patent Literature

Patent Document 1: Japanese Unexamined Patent Application Publication No. 2006-224266

SUMMARY OF INVENTION

Technical Problem

Besides the grain diameter of abrasive grains blended into slurry, other features of the slurry that affect slicing of a workpiece include a slurry viscosity and an abrasive-grains concentration.

The abrasive-grains concentration of slurry affects slicing capability. The higher the abrasive-grains concentration becomes, the higher the slicing capability becomes; the lower the abrasive-grains concentration becomes, the lower the slicing capability becomes. For example, when silicon carbide abrasive grains with a #1500-size are used, the abrasive-grains concentration is adjusted to about 50%.

Moreover, the slurry viscosity affects an action by which abrasive grains are adhered to a wire to supply the abrasive grains to a portion at which a workpiece is sliced, and an excessively low slurry viscosity causes lack of abrasive grains supplied to the portion at which the workpiece is sliced, reducing slicing capability. The slurry viscosity accordingly needs to be adjusted to a certain level or more. Meanwhile, an excessively high slurry viscosity causes an excessively high viscous resistance between the workpiece and the wire, resulting in a wire break and damage of the workpiece due to an excessive force acting on the wire, although a supply of the abrasive grains to the slicing portion is increased. For this reason, the slurry viscosity is preferably from 100 to about 200 mPa·s and, more preferably, from 100 to 150 mPa·s.

The slurry viscosity tends to increase as the abrasive-grains concentration becomes higher and as the number representing a grain size becomes larger, that is, a grain diameter becomes smaller. The abrasive-grains concentration is accordingly adjusted to adjust the slurry viscosity to be within the above desired range.

FIG. 3 shows the relationship between the slurry viscosity and the abrasive-grains concentration when silicon carbide abrasive grains, which are commercially available from Shinano Electric Refining Co., Ltd (trade name: Shinano Random GP), are blended into a water-soluble coolant mainly containing propylene glycol (about 82 percent by mass) and water (about 18 percent by mass).

As depicted in FIG. 3, the slurry viscosity increases as the abrasive-grains concentration becomes higher and as the grain diameter becomes smaller.

Moreover, the rate at which the slurry viscosity increases with respect to an increase in the abrasive-grains concentration increases as the grain diameter becomes smaller. In the slurry using #1000-size abrasive grains and #1500-size abrasive grains, a variation in the slurry viscosity depending on the grain diameter is relatively small, and a change in the abrasive-grains concentration when the slurry viscosity is adjusted to identical viscosities and a change in the slicing capability are also small. In the slurry using #2500-size abrasive grains as compared to these slurries, the slurry viscosity is greatly increases increased as the abrasive-grains concentration becomes higher.

Use of the #2500-size abrasive grains accordingly requires that the abrasive-grains concentration is greatly reduced, for example, to about 40% to adjust the slurry viscosity to be within the 100- to 200-mPa·s range. Unfortunately, the reduction in the abrasive-grains concentration leads to reduction in the slicing capability as above, resulting in increased costs due to increased defective products caused by poor slicing quality and decreased productivity caused by a longer time required for slicing a workpiece.

It is thus difficult to properly adjust both the slurry viscosity and the abrasive-grains concentration to perform slicing with high slicing capability, when abrasive grains having a grain diameter smaller than that of #2000-size abrasive grains, such as #2500-size abrasive grains, are used to reduce a kerf loss.

The present invention has been made in view of the problems described above, and it is an object of the present invention to provide a slurry, for use in slicing of a workpiece with a wire saw, that can suppress reduction in slicing capability due to reduction in abrasive-grains concentration and hence increased costs due to reduction in slicing quality and in productivity, even when abrasive grains having a grain diameter smaller than that of #2000-size abrasive grains are used to reduce a kerf loss, and a method for producing the slurry.

Solution to Problem

To attain the above-described object, the present invention provides a free-abrasive slurry used in a wire saw, comprising abrasive grains having an average circularity of 0.900 or more, the abrasive grains being blended into the slurry.

Such a slurry allows its viscosity to be appropriately adjusted while maintaining a sufficiently high abrasive-grains concentration, thereby suppressing reduction in slicing capability due to reduction in abrasive-grains concentration and hence increased costs due to reduction in slicing quality and in productivity, even when abrasive grains having a grain diameter smaller than that of #2000-size abrasive grains, such as #2500-size abrasive grains, are used to reduce a kerf loss.

The abrasive grains preferably have a diameter of 6.0 μm or less, the diameter being measured at a cumulative height of 50% by a JIS R6002 electrical resistance test method.

Such a slurry allows a kerf loss to be reduced while suppressing reduction in slicing capability due to reduction in abrasive-grains concentration and hence increased costs due to reduction in slicing quality and in productivity.

The abrasive grains preferably have a mass concentration of 50% or more.

Such a slurry has sufficient slicing capability, surely suppressing increased costs due to reduction in slicing quality and in productivity.

The viscosity of the slurry is preferably within a range from 100 mPa·s to 200 mPa·s.

Such a slurry allows sufficient abrasive grains to be supplied to a portion at which a workpiece is sliced to enhance the slicing capability while surely suppressing a wire break and damage of the workpiece due to an excessive force acting on the wire.

Moreover, the present invention provides a method for producing a free-abrasive slurry used in a wire saw, comprising: pulverizing abrasive grains with a roller mill or a ball mill; pulverizing part or all of the abrasive grains again with a jet mill such that the abrasive grains have an average circularity of 0.900 or more; and blending the abrasive grains whose the average circularity is 0.900 or more with a coolant to produce the free-abrasive slurry.

Such a method can surely produce a slurry that allows its viscosity to be appropriately adjusted while maintaining a sufficiently high abrasive-grains concentration, thereby suppressing reduction in slicing capability due to reduction in abrasive-grains concentration and hence increased costs due to reduction in slicing quality and in productivity, even when abrasive grains having a grain diameter smaller than that of #2000-size abrasive grains, such as #2500-size abrasive grains, are used to reduce a kerf loss.

Advantageous Effects of Invention

In the inventive slurry, blended abrasive grains have an average circularity of 0.900 or more, and the slurry therefore allows its viscosity to be appropriately adjusted while maintaining a sufficiently high abrasive-grains concentration, thereby suppressing reduction in slicing capability due to reduction in abrasive-grains concentration and hence increased costs due to reduction in slicing quality and in productivity, even when abrasive grains having a grain diameter smaller than that of #2000-size abrasive grains are used to reduce a kerf loss. The inventive method for producing a slurry involves pulverizing abrasive grains with a roller mill or a ball mill, and pulverizing part or all of the abrasive grains again with a jet mill such that the abrasive grains have an average circularity of 0.900 or more, thereby enabling the inventive slurry to be surely produced.

DESCRIPTION OF EMBODIMENTS

Hereinafter, embodiments of the present invention will be described, but the present invention is not limited to these embodiments.

The present inventor minutely studied why a slurry viscosity significantly increases as an abrasive-grains concentration increases and a countermeasure against the cause with regard to a slurry, for use in a wire saw, in which abrasive grains having a small gain-grain diameter, such as #2500-size abrasive grains, are blended. As a result, the inventor has found out that mutual interference between abrasive grains strongly affects the slurry viscosity and changes under the influence of an abrasive-grains shape, that is, the abrasive-grains shape crucially affects the slurry viscosity, considering that such a slurry contains at a high concentration, such as a concentration of 50%, and the abrasive-grains concentration varies the slurry viscosity.

The inventor also studied the abrasive-grains shape and made findings as follows:

Blending abrasive grains that are pulverized with a jet mill to change its abrasive-grains shape and thereby have an average circularity of 0.900 or more produces a slurry having a lower viscosity with the same abrasive-grains concentration, thus enabling an increase in viscosity of a slurry containing smaller abrasive grains to be suppressed without lowering the mass concentration of the abrasive grains so that the slurry can be used for slicing a workpiece. The inventor thereby brought the present invention to completion.

An outline of slicing of a workpiece with a wire saw will now be described.

Figure 1:
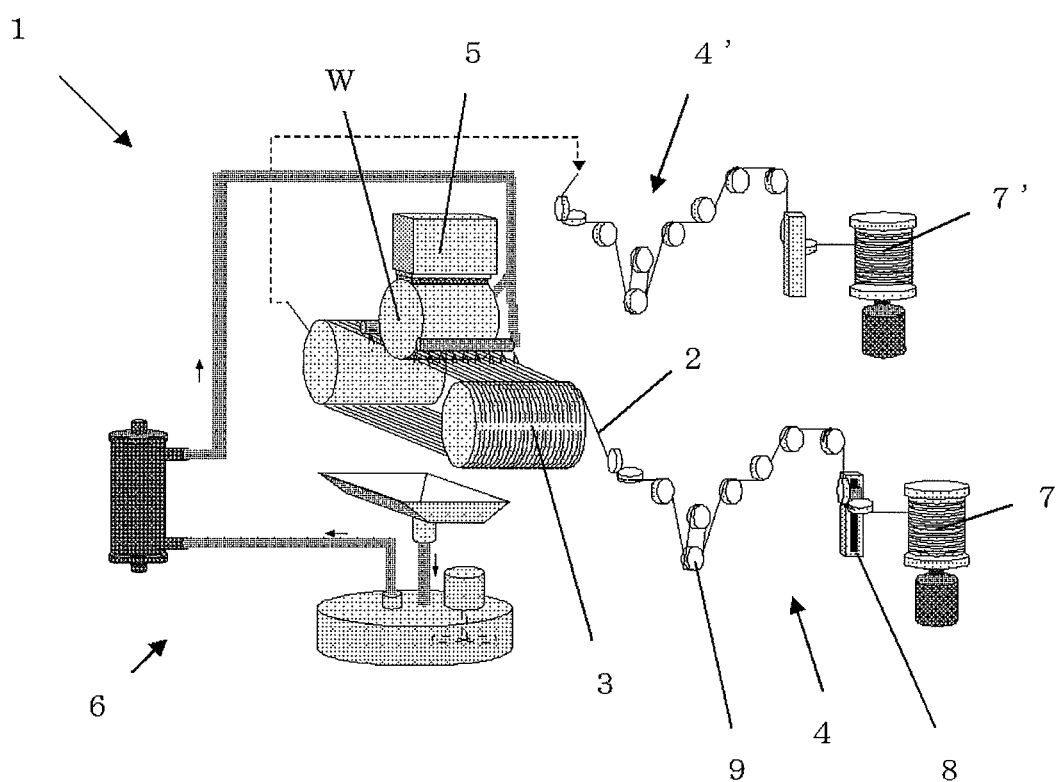
FIG. 1 is a schematic diagram of a common wire saw.

As described in FIG. 1, a wire saw 1 is mainly constituted of a wire 2 for slicing a workpiece W, grooved rollers 3 around which the wire 2 is wound, wire tension applying mechanisms 4 for applying tension to the wire 2, a workpiece feeding mechanism 5 for feeding downward the workpiece W to be sliced, and slurry supplying mechanism 6 for supplying slurry at the time of slicing.

The wire 2 is reeled out from one wire reel 7 and enters the grooved rollers 3 through a traverser 8 after passing through the wire tension applying mechanism 4 formed of a powder clutch (a constant torque motor 9), a dancer roller (a deadweight) (not shown), and so forth. The wire 2 is wound around the grooved rollers 3 about 300 to 400 times and then rolled up around the other wire reel 7' after passing through the other wire tension applying mechanism 4'.

When a workpiece is sliced with such a wire saw 1, the workpiece W is held by the workpiece feeding mechanism 5. Moreover, a suitable tension is applied to the wire 2 by using the wire tension applying mechanism 4, and reciprocating motion is imparted to the wire 2 by a drive motor (not shown). The workpiece W is then fed toward the wire 2 located below by the workpiece feeding mechanism 5 with a slurry being supplied, and pressed against the wire 2, whereby the workpiece W is sliced.

The slurry of the present invention is a slurry of a free-abrasive type that is used for such a slicing process of a workpiece with a wire saw, and the average circularity of abrasive grains blended into the slurry is 0.900 or more.

Here, the circularity is given by dividing the circumferential length of a circle having an area identical to a projection area of a projection image of an abrasive grain by the circumferential length of the projection image of the abrasive grain, and represented by the following expression (1).

$$\text{CIRCULARITY} = \frac{\text{CIRCUMFERENTIAL LENGTH OF CIRCLE HAVING AREA IDENTICAL TO PROJECTION AREA OF PROJECTION IMAGE OF ABRASIVE GRAIN}}{\text{CIRCUMFERENTIAL LENGTH OF PROJECTION IMAGE OF ABRASIVE GRAIN}} \quad (1)$$

The circularity is thus 1 or less, and as the circularity gets closer to 1, an abrasive grain becomes rounder. The circularity can be obtained by analyzing an abrasive grain shape by using a flow particle image analyzer (for example, FPIA-3000 manufactured by Sysmex Corporation). Since slurry generally contains countless abrasive grains, the circularity of every abrasive grain contained in the slurry is ideally represented by circularity averaged over all of the abrasive grains. Since it is actually almost impossible to calculate the circularity of all the abrasive grains blended into the slurry, some samples are extracted from the abrasive grains blended into the slurry and an average value of the samples is calculated. In the invention, this average represents an average circularity.

The slurry of the present invention is composed of abrasive grains whose the average circularity is 0.900 or more blended with a coolant at a predetermined ratio.

Examples of the abrasive grains include silicon carbide abrasive grains. The coolant may be a water-soluble coolant.

Such an inventive slurry allows its viscosity to be appropriately adjusted while maintaining a sufficiently high abrasive-grains concentration, even when abrasive grains having a grain diameter smaller than that of #2000-size abrasive grains, such as #2500-size abrasive grains, are used to reduce a kerf loss. Use of the inventive slurry accordingly enables suppression of reduction in slicing capability due to reduction in abrasive-grains concentration and of increased costs due to reduction in slicing quality and in productivity.

The slurry of the present invention is suitably applied to a case where abrasive grains having a smaller grain diameter are used to reduce a kerf loss. Specifically, the abrasive grains have a diameter of 6.0 μm or less, particularly 5.5 μm or less, which is measured at a cumulative height of 50% by a JIS R6002 electrical resistance test method. Note that an abrasive grain whose the diameter at a cumulative height of 50% is 6.7 μm corresponds to a #2000-size abrasive grain, and an abrasive grain whose the diameter at a cumulative height of 50% is 5.5 μm corresponds to a #2500-size abrasive grain.

Such a slurry allows a kerf loss to be sufficiently reduced while suppressing reduction in slicing capability due to reduction in abrasive-grains concentration and hence increased costs due to reduction in slicing quality and in productivity.

As for the above-described ratio at which the abrasive grains and the coolant are blended, the mass concentration of the abrasive grains blended into the slurry is preferably 50% or more.

Such a slurry has sufficient slicing capability, surely suppressing increase in cost due to reduction in slicing quality and in productivity.

The slurry preferably have a viscosity ranging from 100 mPa·s to 200 mPa·s, more preferably from 100 mPa·s to 150 mPa·s.

Such a slurry allows sufficient abrasive grains to be supplied to a portion at which a workpiece is sliced to enhance the slicing capability while surely suppressing a wire break and damage of the workpiece due to an excessive force acting on the wire.

The above-described slurry of the present invention can be produced by the inventive method for producing a slurry described below.

Figure 2:
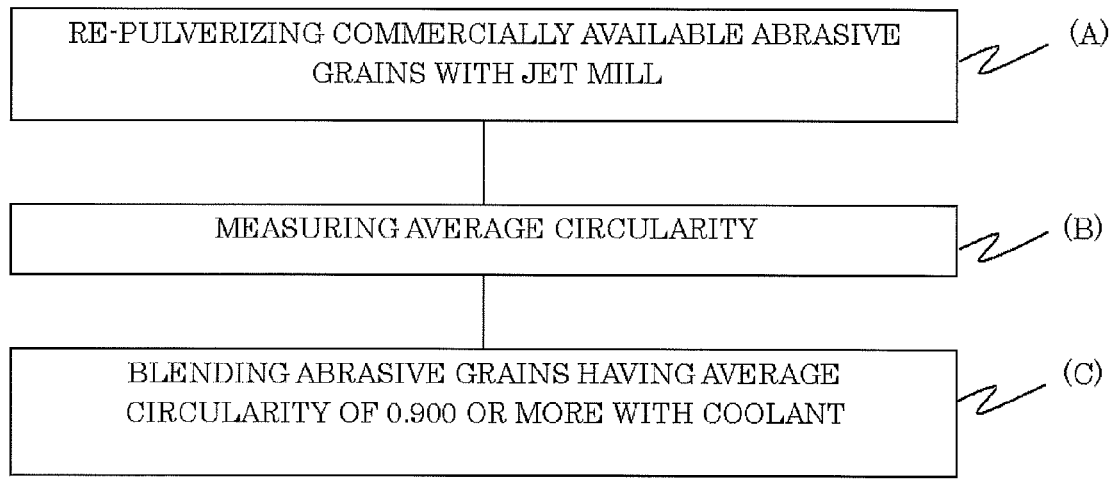
FIG. 2 is a flowchart of an example of a method for producing a slurry of the present invention.
Figure 3:
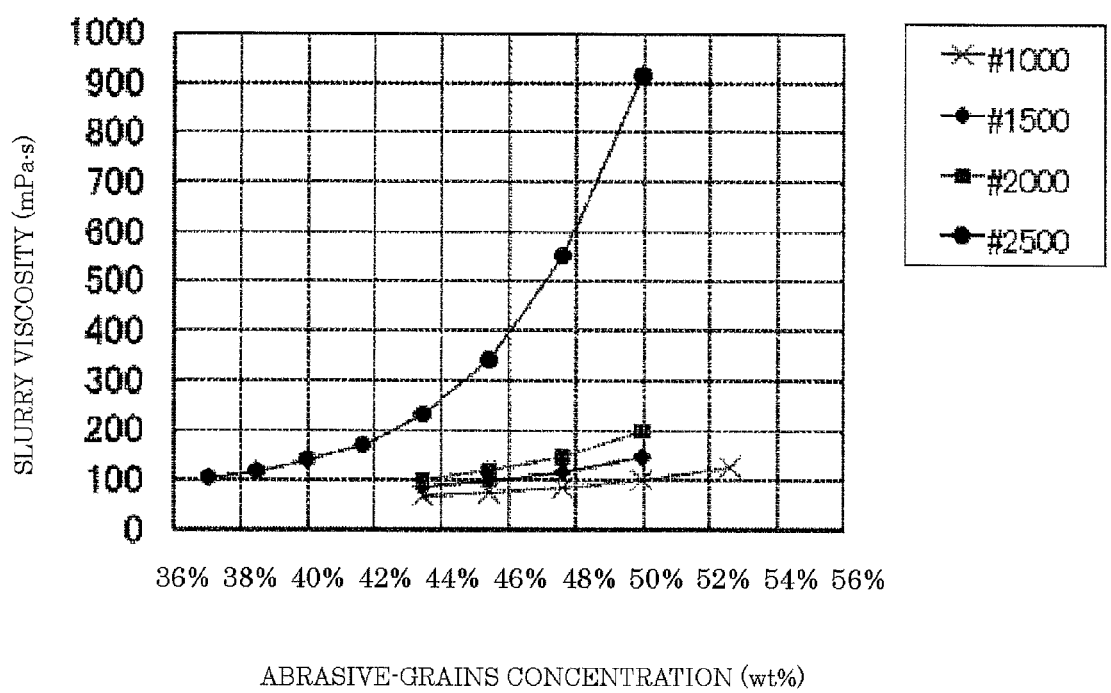
FIG. 3 is an explanatory view of the relationship between an abrasive-grains concentration and a slurry viscosity.

As shown in FIG. 2, the inventive method for producing a slurry involves preparing commercially available abrasive grains pulverized with a roller mill or a ball mill, and pulverizing part or all of the abrasive grains again with a jet mill such that the abrasive grains have an average circularity of 0.900 or more (FIG. 2 at (A)).

Here, commercially available abrasive grains of silicon carbide may be used as the abrasive grains pulverized with a roller mill or a ball mill, which are produced as follows: a lump is produced by reaction between silicon material and carbon material in an electric furnace (an Acheson furnace) according to a production method called the Acheson process; the lump is pulverized with a pulverizer called a roller mill or a ball mill; and the resultant grains are classified to have a desired grain size distribution. The abrasive grains pulverized with the roller mill or the ball mill have a average circularity of less than 0.900.

Here, use of abrasive grains having a grain diameter smaller than that of #2000-size abrasive grains, such as #2500-size abrasive grains, advantageously allows a kerf loss at the time of slicing a workpiece to be surely reduced.

Note that a jet mill is a machine that supplies abrasive grains to the interior of a mill with a high-pressure and high-speed jet to collide the abrasive grains so that the abrasive grains are pulverized.

The average circularity of the abrasive grains re-pulverized is measured by using the flow particle image analyzer, for example (FIG. 2 at (B)). After it is confirmed that the average circularity is 0.900 or more, the abrasive grains, having an average circularity of 0.900 or more, are blended with a coolant to produce the slurry (FIG. 2 at (C)). Here, although an oil coolant may be used as the coolant, a water-soluble coolant is preferably used.

The inventive method for producing a slurry can surely produce the above slurry of the invention, which allows the slurry viscosity to be appropriately adjusted while maintaining a sufficiently high abrasive-grains concentration, thereby suppressing reduction in slicing capability due to reduction in abrasive-grains concentration and increase in cost due to reduction in slicing quality and in productivity, even when abrasive grains having a grain diameter smaller than that of #2000-size abrasive grains, such as #2500-size abrasive grains, are used to reduce a kerf loss.

EXAMPLES

Hereinafter, the present invention will be described more specifically with examples and comparative examples of the present invention, but the present invention is not limited to these examples.

Example 1

The slurry of the present invention was produced in accordance with the method for producing a slurry of the present invention.

A flow particle image analyzer, FPIA-3000, manufactured by Sysmex Corporation was used to measure the average circularity of silicon carbide abrasive grains of #1500-, #2000-, and #2500-size (trade name: Shinano Random GP), which are commercially available from Shinano Electric Refining Co., Ltd. The average circularity was 0.886 for #1500, 0.888 for #2000, and 0.889 for #2500, which were less than 0.900.

Among them, the #2000-size silicon carbide abrasive grains were pulverized with a jet mill, and the average circularity thereof was measured. Here, a value obtained by subtracting the grain diameter after the pulverization from that before the pulverization was defined as a pulverization amount, which represents an index of the degree of pulverization of the abrasive grains with the jet mill. The pulverization amount was set in three levels: 0.1 μm, 0.7 μm, and 1.2 μm. Note that a sample for a pulverization amount of 1.2 μm is a abrasive grain having a grain diameter of 5.5 μm, which corresponds to the #2500-size abrasive grain. The average circularity of the abrasive grains after the pulverization with the jet mill changed to 0.899 for a pulverization amount of 0.1 μm, 0.913 for a pulverization amount of 0.7 μm, and 0.923 for a pulverization amount of 1.2 μm from 0.888 before the pulverization. This indicates that the greater the pulverization amount, the closer the average circularity to 1 and the abrasive grain shape approached a perfect circle.

Accordingly, samples from the abrasive grains for a pulverization amount of 0.7 μm and samples from the abrasive grains for a pulverization amount of 1.2 μm, both of which the average circularity was 0.900 or more, were blended into a water-soluble coolant mainly containing propylene glycol (about 82 percent by mass) and water (about 18 percent by mass) at a mass concentration of 50%, whereby the slurry of the present invention was produced. The viscosity of the slurry, measured with a digital viscometer (TVB-10 manufactured by Toki Sangyo Co., Ltd.), was 137.8 mPa·s for a pulverization amount of 0.7 μm and 121.9 mPa·s for a pulverization amount of 1.2 μm.

The slurry thus had a viscosity adjusted within the 100- to 200-mPa·s range while keeping the abrasive-grains concentration sufficiently high (50%), even when using the abrasive grains having a grain diameter smaller than that of the #2000-size abrasive grains. In particular, when the slurry of Example 1 using the abrasive grains for a pulverization amount of 1.2 μm, corresponding to the #2500-size abrasive grains, was compared with the slurry of the later-described Comparative Example 1, the slurry in Example 1 had appropriately adjusted viscosity while keeping its abrasive-grains concentration a sufficiently high, whereas the slurry in Comparative Example 1 had a significantly increased viscosity of 914 mPa·s for a abrasive-grains concentration of 50%. In Comparative Example 1, it is necessary to reduce the abrasive-grains concentration to about 43%, more preferably, to about 39% to adjust the slurry viscosity to be within the 100- to 200-mPa·s range, which revealed that reduction in slicing capability cannot be avoided.

Example 2

A silicon ingot having a diameter of 300 mm and a length of 200 mm was sliced with a wire saw by using the inventive slurry produced in Example 1 for a pulverization amount of 1.2 μm, and the slicing capability and the slicing quality were evaluated. Here, the slicing capability was evaluated on the basis of maximum deflection of a wire during slicing the workpiece. In slicing of the workpiece with the wire saw, since a rate at which the workpiece is fed to the wire is set before the start of slicing, use of a slurry exhibiting a higher slicing capability makes the wire deflection smaller, whereas use of a slurry exhibiting a lower slicing capability makes the wire deflection larger. Moreover, Total Thickness Variation (TTV) and Warp-bf averaged over all the sliced wafers were evaluated.

As a result, the maximum wire deflection was 8 mm, which was reduced by 20% compared to a maximum wire deflection of 10 mm in the later-described Comparative Example 2.

Moreover, as for the slicing quality, TTV was 6.8 μm and Warp-bf was 6.7 μm, which were improved compared to a TTV of 9.1 μm, and a Warp-bf of 15.8 μm in later-described Comparative Example 2.

Comparative Example 1

A commercially available silicon carbide abrasive grains were directly blended into a water-soluble coolant at a mass concentration of 50% to produce a slurry. Here, #2500-size abrasive grains were used as the silicon carbide abrasive grains. The average circularity of the abrasive grains was 0.889, which was less than 0.900.

The viscosity of the produced slurry measured was 914 mPa·s, which is greatly larger than a viscosity, suitable for slicing a workpiece with a wire saw, ranging from the 100- to 200-mPa·s. This slurry was not able to use to slice a workpiece with a wire saw. The mass concentration of the abrasive grains needed to be reduced to about 39% to adjust the slurry viscosity to 120 mPa·s.

Comparative Example 2

A silicon ingot was sliced under the same conditions as those of Example 2 except that the slurry produced in Comparative Example 1, having a viscosity of 120 mPa·s and a abrasive-grains mass concentration of 39% was used, and the evaluation was performed in a manner similar to Example 2.

As a result, the maximum wire deflection was 10 mm, which was worse than the result of Example 2.

Moreover, as for the slicing quality, TTV was 9.1 μm and Warp-bf was 15.8 μm, which was worse than the result of Example 2.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A free-abrasive slurry, comprising silicon carbide abrasive grains having a grain diameter smaller than that of #2000-size abrasive grains and an average circularity of 0.900 or more,
wherein:
the slurry is used in a wire saw,
the abrasive grains have a mass concentration of 50% or more, and
the abrasive grains are blended into the slurry.

2. The slurry according to claim 1, wherein the abrasive grains have a diameter of 6.0 μm or less, the diameter being measured at a cumulative height of 50% by a JIS R6002 electrical resistance test method.

3. The slurry according to claim 1, wherein a viscosity of the slurry is within a range from 100 mPa·s to 200 mPa·s.

4. The slurry according to claim 2, wherein a viscosity of the slurry is within a range from 100 mPa·s to 200 mPa·s.

5. A method for producing a free-abrasive slurry, comprising:
pulverizing silicon carbide abrasive grains with a roller mill or a ball mill;
pulverizing part or all of the abrasive grains again with a jet mill such that the abrasive grains have a grain diameter smaller than that of #2000-size abrasive grains and an average circularity of 0.900 or more; and
blending the abrasive grains whose average circularity is 0.900 or more with a coolant to produce the free-abrasive slurry for use in a wire saw, where the abrasive grains have a mass concentration of 50% or more.

\* \* \* \* \*